Figure 1:
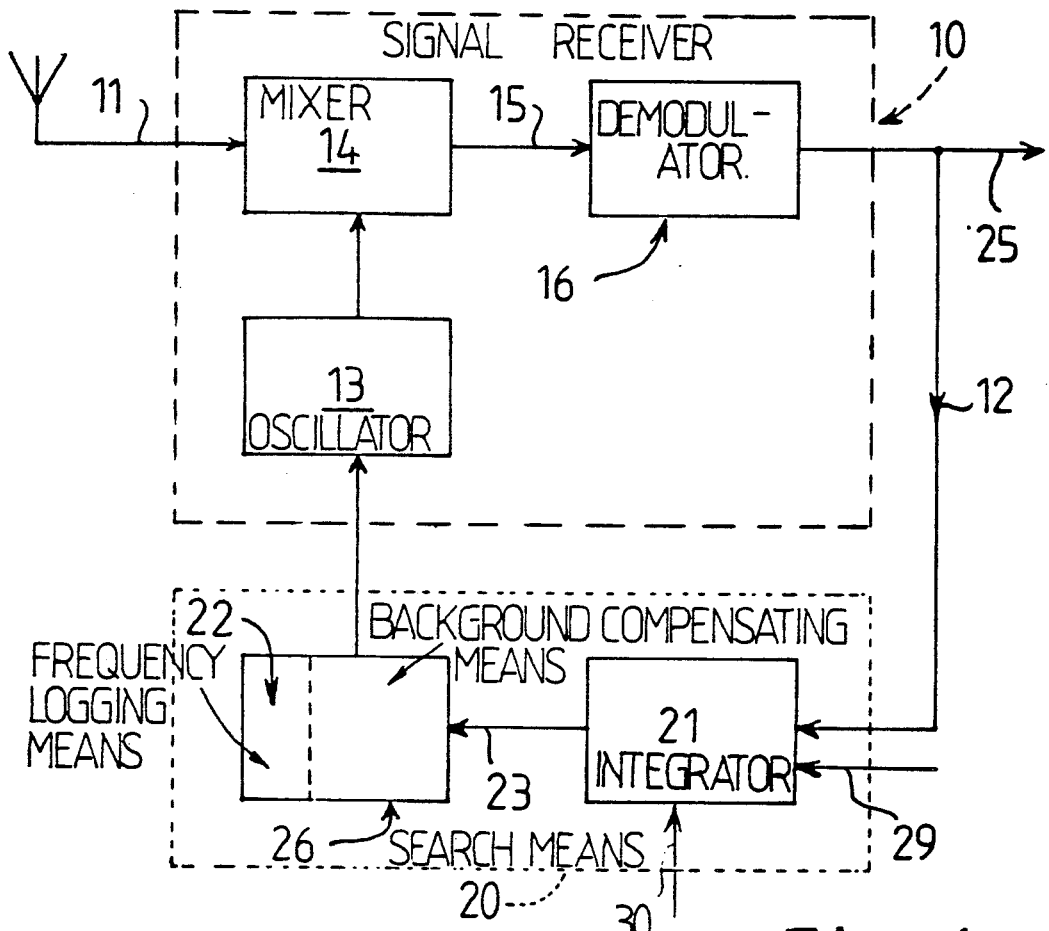

United States Patent [19]

Gamgee et al.

[11] Patent Number: 5,134,720
[45] Date of Patent: Jul. 28, 1992

[54] SIGNAL LOCATING APPARATUS

[75] Inventors: Christopher J. Gamgee, Carnegie; Alan H. F. Nickols, Oakleigh, both of Australia

[73] Assignee: Amskan Limited, Oakleigh, Australia

[21] Appl. No.: 646,528

[22] Filed: Jan. 25, 1991

Related U.S. Application Data

[63] Continuation of Ser. No. 245,792, Sep. 16, 1988, abandoned.

[30] Foreign Application Priority Data

Sep. 17, 1987 [AU] Australia ................. PI4409

[51] Int. Cl.$^5$ ............................... H04B 1/16
[52] U.S. Cl. ................. 455/164.1; 455/184.1; 455/192.1; 340/825.72
[58] Field of Search ........... 455/164, 165, 161, 182, 455/184, 192; 340/825.34, 825.54, 825.67, 825.72; 324/100

[56] References Cited

U.S. PATENT DOCUMENTS

| | | | |
|---|---|---|---|
| 3,893,113 | 7/1975 | Iten et al. | 342/100 |
| 4,498,191 | 2/1985 | Rogers | 455/164 |
| 4,592,094 | 5/1986 | Ufkes | 455/164 |
| 4,780,909 | 10/1988 | Sakashita et al. | 455/161 |

FOREIGN PATENT DOCUMENTS 0108643 5/1984 European Pat. Off. .

*Primary Examiner*—Stephen Chin
*Attorney, Agent, or Firm*—Blakely, Sokoloff, Taylor & Zafman

[57] ABSTRACT

A signal locating apparatus for locating within a frequency band an input signal of a first frequency, the signal locating apparatus including a signal receiver for receiving the input signal. The signal receiver is characterized by having a relatively narrow bandwidth response of variable center frequency, the signal receiver being capable of generating a detected signal when the center frequency is substantially equal to the first frequency, the signal locating apparatus further including search device for varying the center frequency at a relatively high rate so as to cause the signal receiver to search for the presence of the input signal within a frequency band, the search device being operable in response to generation of the detected signal to stop the search for the presence of the input signal. The signal receiver includes an oscillator of variable frequency which determines the center frequency, a mixer receiving the input signal and operative to generate an intermediate frequency signal and a demodulator connected to receive the intermediate frequency signal and operative to generate the detected signal upon receipt of the intermediate frequency signal. The search device includes an integrator connected so as to receive the output signal of the demodulator so that the occurrence of the detected signal at the demodulator output causes an abrupt change in the integrator output.

5 Claims, 1 Drawing Sheet

SIGNAL LOCATING APPARATUS

This is a continuation of application Ser. No. 245,792 filed Sep. 16, 1988, now abandoned.

This invention relates to apparatus for locating an input signal within a frequency band. The invention relates particularly to the location of an input signal from a radio transmitter and it will be generally convenient to describe the invention in relation to this particular field of use, however the invention is not limited to this particular type of signal.

The apparatus of the present invention has been developed for use in relation to electronic apparatus for identification of objects including people, animals, and objects e.g. as shown in EP No. 0108643. Such an identification system includes interrogator means for generating an interrogation signal. The apparatus also includes on or more transponders, each of which includes an interrogation signal receiver for receiving the interrogation signal and operative in response to transmit a radio frequency reply signal containing coded information to enable identification of the particular transponder and its bearer. The apparatus includes an RF receiver for receiving the reply signal to enable decoding of the information.

In the case of such an identification apparatus, a number of transponders would normally be provided and the apparatus is operative to read data transmitted by the transponders. The transponders may generate the coded information signals within a nominal frequency band, e.g. around 400 MHz. As the transmitter frequency of such transponders is controlled for example by tolerances of the components of the transponder which are relatively inexpensive devices manufactured to low tolerances, there is some variation to be expected in the transmitter frequency. For, example variations up to perhaps 0.5 MHz may be expected.

To enable the receiver to identify signals within a band of frequencies, it is possible to made the receiver in such a way as to have a wideband response. However this reduced the sensitivity of the receiver to low power signals which are likely to be encountered in an identification apparatus having low power transponders.

Because low power transponders should be designed to have a maximum useful life, the transponder should not be designed to transmit information signals for relatively long periods of time in order to ensure that the signal receiver detects and decodes the signal.

It is an object of the present invention to provide a signal locating apparatus for locating an input signal within any frequency band.

A preferred object of the present invention is to provide a signal locating apparatus which can relatively rapidly locate an input signal within a frequency band, but with minimum bandwidth to maximise sensitivity. This will enable a relatively short duration signal of unknown frequency (within a band) to be located.

According to the present invention there is provided a signal locating apparatus for locating an input signal of a first frequency within a frequency band, the signal locating apparatus including a signal receiver for receiving signals in the frequency band including the input signal, the signal receiver being characterised by having a relatively narrow bandwidth response of variable centre frequency, the signal receiver including a detector operative to generate a detected signal on a signal line when the centre frequency is substantially equal to the first frequency, the signal locating apparatus further including search means for varying the centre frequency of the signal receiver at a relatively high rate so as to cause the signal receiver to search for the presence of the input signal within the frequency band, the search means including an integrator operative to generate an integrator output signal, the integrator output signal having a varying characteristic after the application of an initialisation signal thereto and in the absence of the detected signal, the signal receiver being responsive to the varying integrator output signal to vary the centre frequency thereof, the signal receiver being operable in response to occurrence of the detected signal on the signal line to stop the variation in the integrator output signal and hence stop the variation of the centre frequency and hence stop the search for the presence of the input signal.

Possible and preferred features of the present invention are illustrated in the accompanying drawings. However it is to be understood that the features illustrated in and described with reference to the drawings are not to be construed as limiting on the scope of the invention.

Figure 2:
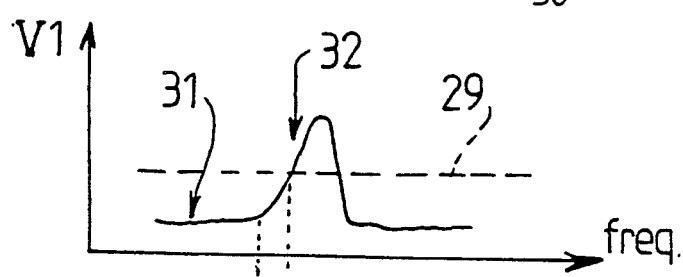
Figure 2:
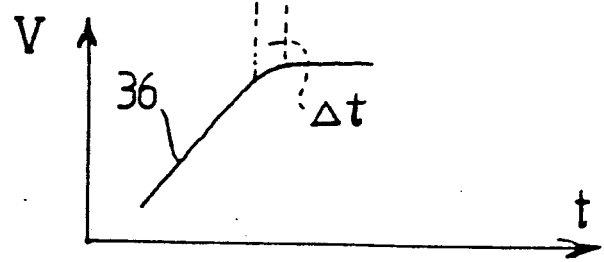

FIG. 1 shows a block schematic diagram of a signal locating apparatus according to one possible embodiment of the present invention, and FIG. 2 shows typical waveforms for the demodulator and integrator outputs.

The signal locating apparatus illustrated in FIG. 1 is for locating within a frequency band an input signal of a first frequency. The apparatus includes a signal receiver 10 for receiving an input 11 within the frequency band and which includes the input signal sought, the signal receiver 10 having a relatively narrow bandwidth response of variable centre frequency. The first part of FIG. 2 shows the signal receiver output if the centre frequency is swept through the entire band. The signal receive 10 generates a detected signal 32 (FIG. 2) when the centre frequency is substantially equal to the first frequency. The signal locating apparatus also includes search means 20 for varying the centre frequency at a relatively high rate so as to cause the signal receiver 10 to search for the presence of the input signal within a frequency band, the search means 20 being operable in response to generation of the detected signal 32 to stop the search for the presence of the input signal. In particular the search means 20 stops varying the centre frequency in response to generation of the detected signal 32.

The signal receiver 10 includes an oscillator 13 of variable frequency which determines the centre frequency. The signal receiver 10 further includes a mixer 14 receiving the input 11 and operative to generate an intermediate frequency (IF) signal 15 if the oscillator frequency is correctly offset from the input signal frequency. The IF signal 15 is then applied to a demodulator 16 (or FM detector), the demodulator 16 generating the detected signal 32 upon receipt of the IF signal 15. If the input signal is absent, the input 11 comprises a background noise signal which is input to the demodulator 16 and this in turn produces at the output of the demodulator 16 a signal 31 (FIG. 2) related to the noise level, this output for example being a voltage level.

The search means 20 is operable to vary the oscillator frequency in order to control the centre frequency. The search means 20 is operable to cause the oscillator frequency to continuously vary from one extreme of the frequency band towards the other. For example, the oscillator 13 may be caused to scan for an input frequency from 399.5 MHz toward 400.5 MHz.

The search means 20 includes an integrator 21 which controls scanning of the centre frequency of the signal receiver 10, the integrator 21 being connected to demodulator output line 12 so that the occurrence of the detected signal 32 on the demodulator output line 12, after an initialisation signal 30 is applied to the integrator 21 at the beginning of the sweep or scan of the frequency band, causes an abrupt change in the integrator output (FIG. 2). If the receiver centre frequency is not equal to the first frequency, the output of the demodulator 16 is a first voltage level 31 resulting from background signal noise, this voltage level 31 at the output of the demodulator 16 being applied to the integrator 21 which in turn provides an output ramp signal 36 on line 23 which is used to control sweeping or scanning of the oscillator frequency. This is achieved by applying a reference voltage 29 related to an expected or predetermined level of the detected signal 32. The integrator 21 determines the function:

$$\int (V1 - Vref) \, dt$$

where V1 is the level of the demodulator output 31 and Vref is the level of the reference voltage 29. The value of this function, and hence the output signal 36 ceases to ramp as shown in the lower part of FIG. 2 when the detected signal 32 reaches the level of the reference signal 29. This stops the sweeping or scanning of the centre frequency of the receiver 10. Up to the time that the detected signal 32 appears, the integrator output signal 36 is a ramp which causes continuous scanning of the centre frequency. When the integrator output signal 36 stops ramping this can then effectively "lock" the oscillator frequency to the desired first frequency. Any "overshoot" of the centre frequency causes a reversal of the integrator output 36 which will reduce the centre frequency back to the input first frequency. The demodulator output signal 31 can be passed to output 25 for enabling processing, such as extraction of coded information.

The signal locating apparatus in one possible embodiment has an integrator 21 which has a selectively variable time constant so as to be operable as a sweep rate controller operable in response to an initial indication of the presence of the detected signal 32 to vary the time constant of the integrator 21 so as to reduce the ramp rate and hence reduce the rate of search. That is, in response to commencement of the detected signal 32, the rate of sweeping of the oscillator frequency is reduced to provide slower more precise "locking" of the signal receiver centre frequency to the first frequency. This can occur in response to the rise of the demodulator output 31 during time interval Δt as shown in FIG. 2.

The signal locating apparatus further includes frequency logging means 22 operable preferably before an input signal locating operation is carried out (although possibly after such an operation) to scan the frequency range and log the background signal data. In this embodiment the apparatus further includes background compensating means 26 operable during the input locating operation to use the logged background signal data to compensate for background signal effects and reduce the chance of a spurious background signal being detected and identified as the input signal sought.

Preferably the frequency logging operation is initiated substantially immediately before a time window within which an input signal is to be expected and identified. For example in an object identification apparatus, an interrogation signal may be generated and directed towards a transponder which responds after a known predetermined delay period. In this environment, the logging operating is preferably carried out immediately before the response time window of the transponder.

The frequency logging means 22 and background compensating means 26 may be comprised by a microprocessor. The microprocessor 26 is arranged to be responsive to the output 26 of the integrator 21 and controls the scan rate of the oscillator 13. During the logging operation the microprocessor 26 monitors and stores in memory the output 26 of the integrator 21. During the input signal search operation, the microprocessor 26 is operative to continuously compare the integrator output 26 to the logging operation data in memory to thereby enable an increase in selectivity of the apparatus to a genuine input signal and reduce the risk of a background signal (e.g. from some RF source nearby) being identified as the input signal sought.

It will be seen that the preferred embodiment of the signal locating apparatus described herein and illustrated in the drawing will relatively quickly scan through a frequency band within which an input signal of a relatively constant but unknown frequency is to be encountered. Thus the sensitivity of the system within which the apparatus is incorporated can be relatively high by enabling a specific frequency to be locked onto. This also enables the system to be used with relatively low power input signals. These features make the signal locating apparatus particularly suitable for use with inexpensive transponders used in an object identification system.

We claim:

1. A signal locating apparatus for locating an input signal of a first frequency within a frequency band, the signal locating apparatus including a signal receiver for receiving signals in the frequency band including the input signal, the signal receiver being characterized by having a relatively narrow bandwidth response of variable centre frequency, the signal receiver including a detector operative to generate a detected signal on a signal line when the centre frequency is substantially equal to the first frequency, the signal locating apparatus further including search means coupled to the signal receiver and operative to cause the signal receiver to search for the presence of the input signal within the frequency band, the search means including an integrator operative after the application of an initialization signal thereto and in the absence of the detected signal to commence to generate an integrator output signal, the integrator output signal having a progressively varying characteristic, the signal receive being responsive to the progressively varying integrator output signal to vary the centre frequency thereof, the search means being operable in response to occurence of the detected signal on the signal line to stop the variation in the integrator output signal and hence stop the variation of the centre frequency and hence stop the search for the presence of the input signal, the integrator having a variable time constant so as to be operable as a sweep rate controller, the integrator being operative in response to an initial indication of the presence of the detected signal to vary the time constant of the integrator so as to reduce the ramp rate and hence reduce the rate of change of the centre frequency.

2. A signal locating apparatus as claimed in claim 1 characterised in that, if the receiver centre frequency is not equal to the first frequency, the output of the detector on the signal line comprises a first voltage level which is applied to the integrator so that the integrator output signal comprises a ramp signal which is used to control sweeping or scanning of the centre frequency of the signal receiver.

3. A signal locating apparatus as claimed in claim 2 characterised in that the integrator receives a reference signal related to a level of the detected signal, and the integrator output signal ceases to ramp when the detected signal reaches the level of the reference signal hence stopping sweeping or scanning of the centre frequency of the signal receiver.

4. A signal locating apparatus for locating an input signal of a first frequency within a frequency band, the signal locating apparatus including a signal receiver for receiving signals in the frequency band including the input signal, the signal receiver being characterised by having a relatively narrow bandwidth response of variable centre frequency, the signal receiver including a detector operative to generate a detected signal on a signal line when the centre frequency is substantially equal to the first frequency, the signal locating apparatus further including search means coupled to the signal receiver and operative to cause the signal receiver to search for the presence of the input signal within the frequency band, the search means including an integrator operative after the application of an initialization signal thereto and in the absence of the detected signal to commence to generate an integrator output signal, the integrator output signal having a progressively varying characteristic, the signal receiver being responsive to the progressively varying integrator output signal to vary the centre frequency thereof, the search means being operable in response to occurrence of the detected signal on the signal line to stop the variation in the integrator output signal and hence stop the variation of the centre frequency and hence stop the search for the presence of the input signal, the signal receiver further including frequency logging means operable to scan the frequency band and to log the background signal data, the signal locating apparatus further including background compensating means operable, during an operation of the apparatus for the purpose of locating an input signal, to use the logged background signal data to compensate for background signal effects and reduce the chance of a spurious background signal being detected and identified as the input signal sought, the signal locating apparatus being associated with a predetermined delay period, the frequency logging means being operable substantially immediately before a time window occurring after said delay period.

5. A signal locating apparatus as claimed in claim 4 characterised in that the frequency logging means and background compensating means are comprised by a processor connected and operative in response to the output of the integrator, the processor controlling in use the scan rate of the signal receiver, the processor being operative during a background logging operation to monitor and store in a memory the output of the integrator, the processor being operative during an operation of the apparatus to search for the presence of an input signal to compare the integrator output to the logging operation data in memory so as to thereby enable an increase in selectivity of the apparatus to a genuine input signal and reduce the risk of a background signal being identified as the input signal sought.

* * * * *

UNITED STATES PATENT AND TRADEMARK OFFICE
CERTIFICATE OF CORRECTION

PATENT NO. : 5,134,720
DATED : July 28, 1992
INVENTOR(S) : Gamgee et al.

It is certified that error appears in the above-identified patent and that said Letters Patent is hereby corrected as shown below:

| | | |
|---|---|---|
| col. 01, line 22 | after "frequency" | insert --(RF)-- |
| col. 04, line 54 | delete "receive" | insert --receiver-- |

Signed and Sealed this

Eighth Day of February, 1994

*Attest:*

BRUCE LEHMAN

*Attesting Officer*    *Commissioner of Patents and Trademarks*